US011411546B2

(12) United States Patent
Goto (10) Patent No.: US 11,411,546 B2
(45) Date of Patent: Aug. 9, 2022

(54) RESONANCE DEVICE AND METHOD FOR MANUFACTURING RESONANCE DEVICE (71) Applicant: Murata Manufacturing Co., Ltd., Nagaokakyo (JP)

(72) Inventor: Yuichi Goto, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 0 days.

(21) Appl. No.: 17/407,377

(22) Filed: Aug. 20, 2021

(65) Prior Publication Data

US 2021/0384882 A1 Dec. 9, 2021

Related U.S. Application Data (63) Continuation of application No. PCT/JP2019/049978, filed on Dec. 20, 2019.

(30) Foreign Application Priority Data

Apr. 18, 2019 (JP) .............................. JP2019-079391

(51) Int. Cl.
*H03H 9/02* (2006.01)
*B81B 3/00* (2006.01)
*H03H 9/05* (2006.01)
*H03H 9/24* (2006.01)

(52) U.S. Cl.
CPC ......... *H03H 9/0207* (2013.01); *B81B 3/0035* (2013.01); *H03H 9/0538* (2013.01); *H03H 9/2405* (2013.01); *B81B 2201/0271* (2013.01)

(58) Field of Classification Search
CPC .. H03H 9/0207; H03H 9/0538; H03H 9/2405; H03H 9/24; B81B 3/0035; B81B 3/0045; H01L 41/053; H01L 41/09; H01L 41/187
See application file for complete search history.

(56) References Cited

U.S. PATENT DOCUMENTS

2017/0069822 A1   3/2017   Nishimura
2017/0222621 A1   8/2017   Nishimura et al.

FOREIGN PATENT DOCUMENTS

JP           2010232943 A       10/2010
JP           2012156592 A        8/2012
JP   PCT/JP2016/068476   *   3/2017   ........... H03H 9/1057
(Continued)

OTHER PUBLICATIONS

Machine translation of WO 2017/051572 (Year: 2017).*
(Continued)

*Primary Examiner* — Jeffrey M Shin
(74) *Attorney, Agent, or Firm* — ArentFox Schiff LLP (57) ABSTRACT A resonator is provided that includes a vibrating section that vibrates in a contour vibration mode, a frame that surrounds at least a portion of the vibrating section, supporting sections extending along a Y-axis direction and connecting the vibrating section and the frame. The vibrating section includes a through hole that extends along an X-axis direction perpendicular to the Y-axis direction such that a coupling section is disposed between the through hole and each of the supporting sections. The length SL of the through hole in the X-axis direction is longer than the length Sd of the coupling section in the Y-axis direction.

19 Claims, 11 Drawing Sheets (56) References Cited

FOREIGN PATENT DOCUMENTS

| WO | 2016006433 A1 | 1/2016 |
| WO | 2016114237 A1 | 7/2016 |

OTHER PUBLICATIONS

Written Opinion of the International Searching Authority issued for PCT/JP2019/049978, dated Feb. 25, 2020.
International Search Report issued for PCT/JP2019/049978, dated Feb. 25, 2020.

* cited by examiner

RESONANCE DEVICE AND METHOD FOR MANUFACTURING RESONANCE DEVICE

CROSS REFERENCE TO RELATED APPLICATIONS

The present application is a continuation of PCT/JP2019/049978 filed Dec. 20, 2019, which claims priority to Japanese Patent Application No. 2019-079391, filed Apr. 18, 2019, the entire contents of each of which are incorporated herein by reference.

TECHNICAL FIELD

The present invention relates to a resonator and a resonance device.

BACKGROUND

Resonance devices manufactured by micro-electromechanical systems (MEMS) techniques are widely available. Such devices can be formed by, for example, joining an upper substrate to a lower substrate including a resonator.

International Publication No. 2016/006433 (hereinafter "Patent Document 1") discloses a vibration device in which a vibration plate includes a plurality of vibration members and vibrates at a harmonic of contour vibration, a first end portion of a support member is connected to the vibration plate, a frame-shaped base member is connected to a second end portion of the support member and surrounds the vibration plate, and a cavity extending in a direction intersecting with the direction in which the support member extends is disposed in the base member such that a flexure-vibration member is disposed. Moreover, both ends of the flexure-vibration member are continuous with the remaining portion of the base member, each of the continuous portions is a fixed end of the flexure-vibration member, and the length between the portion of the flexure-vibration member connected to the second end portion of the support member and the fixed end of the flexure-vibration member is $\lambda/4$, where $\lambda$ is the wavelength of the flexure vibration corresponding to the frequency of characteristic vibration of the vibration plate. The vibration characteristics of the vibration device is improved by providing the cavity to the base member such that the flexure-vibration member is disposed and thus confining the vibration of the vibration plate.

However, as in the device in Patent Document 1, when the cavity (hole) is disposed in the base (holding section) surrounding the vibrating plate and holding the vibration plate, the dimensions are larger than those in the case where the cavity (hole) is absent.

SUMMARY OF THE INVENTION

Accordingly, it is an object of the present invention to provide a resonator and a resonance device whose resonator characteristics can be improved while an increase in the dimensions is suppressed.

As such, a resonator according to an exemplary aspect is provided that includes a vibrating section configured to vibrate in a contour vibration mode, a frame surrounding at least a portion of the vibrating section, and a supporting section extending along a first direction and connecting the vibrating section and the holding section. The vibrating section includes a through hole extending along a second direction perpendicular to the first direction such that a coupling section is disposed between the through hole and the supporting section. Moreover, a length of the through hole in the second direction is longer than a length of the coupling section in the first direction.

In another aspect, a resonance device is provided that includes the above-described resonator and a lid unit.

According to the present invention, the resonator characteristics are improved while an increase in the dimensions is suppressed.

DETAILED DESCRIPTION OF EMBODIMENTS

Exemplary embodiments of the present invention are described below. In the description of the drawings below, the same or similar components are denoted by the same or similar reference numerals. The drawings are illustrative, the dimensions and shapes of the portions are schematic, and the technical scope of the present invention is not to be limited to the embodiments.

EXEMPLARY EMBODIMENTS

Figure 1:
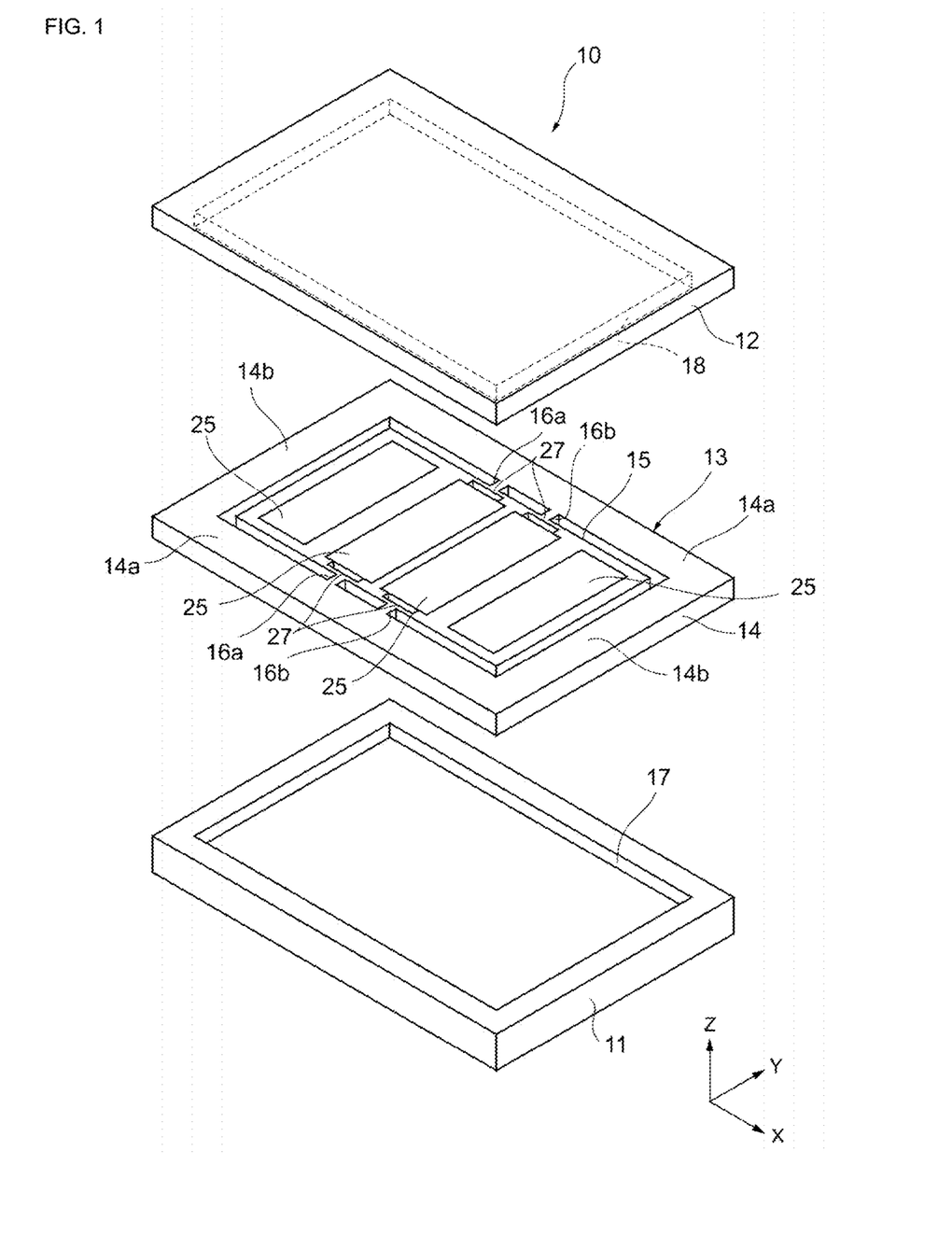
FIG. 1 is an exploded perspective view that schematically illustrates a structure of a resonance device according to an exemplary embodiment.

First, a schematic configuration of a resonance device according to one exemplary embodiment is described with reference to FIG. 1. FIG. 1 is an exploded perspective view that schematically illustrates a structure of a resonance device 10 according to the exemplary embodiment.

As illustrated in FIG. 1, an example outline of the resonance device 10 can be a rectangular parallelepiped shape according to the exemplary aspect. As shown, the resonance device 10 includes a lower substrate 11, an upper substrate 12, and a resonator 13 held between the lower substrate 11 and the upper substrate 12. The lower substrate 11 and the upper substrate 12 correspond to an example of "lid unit" in the present disclosure.

The configurations of the resonance device 10 are described below. In the following description, in the resonance device 10, the side where the upper substrate 12 is disposed is referred to as the upper (or front) side, and the side where the lower substrate 11 is disposed is referred to as the lower (or back) side.

Preferably, the resonator 13 is an MEMS vibrator produced by the use of the MEMS technique. The resonator 13 includes a holding section 14 (or a frame), a vibrating section 15, and two sets of supporting sections 16a, 16a and 16b, 16b (or connecting arms) that connect the holding section 14 and the vibrating section 15.

The holding section 14 surrounds at least a portion of the vibrating section 15. Specifically, an example of the holding section 14 or the frame has a rectangular frame shape extending along an XY plane in the rectangular coordinate system in FIG. 1. The holding section 14 includes a set of frame units 14a, 14a extending in parallel with the X axis and being the long sides and a set of frame units 14b, 14b extending in parallel with the Y axis, being the short sides, and having the opposite ends connected to the opposite ends of the frame units 14a, 14a, respectively.

The vibrating section 15 is arranged inside the holding section 14. Like the holding section 14, one example of the vibrating section 15 extends along the XY plane and forms a rectangular shape. The vibrating section 15 has a first side and a second side being long and extending in parallel with each other along the X-axis direction. The first and second sides of the vibrating section 15 extend substantially in parallel with the frame units 14a, 14a, respectively.

Each of the set of supporting sections 16a, 16a and the set of supporting sections 16b, 16b extends in a straight line substantially parallel with the Y axis and connects the frame units 14a, 14a to the vibrating section 15.

The lower substrate 11 is flat-shaped and extends along the XY plane. The lower substrate 11 has a recess section 17 in its upper surface, and an example of the recess section 17 has a rectangular parallelepiped shape. The recess section 17 forms a portion of vibration space for the vibrating section 15.

The upper substrate 12 is flat-shaped and extends along the XY plane, like the lower substrate 11. The upper substrate 12 has a recess section 18 in its lower surface, and an example of the recess section 18 has a rectangular parallelepiped shape. The recess section 18 forms a portion of vibration space for the vibrating section 15. This vibration space is hermetically sealed, and its vacuum state is maintained. The lower substrate 11 and the upper substrate 12 are formed by the use of, for example, a silicon substrate.

Figure 2:
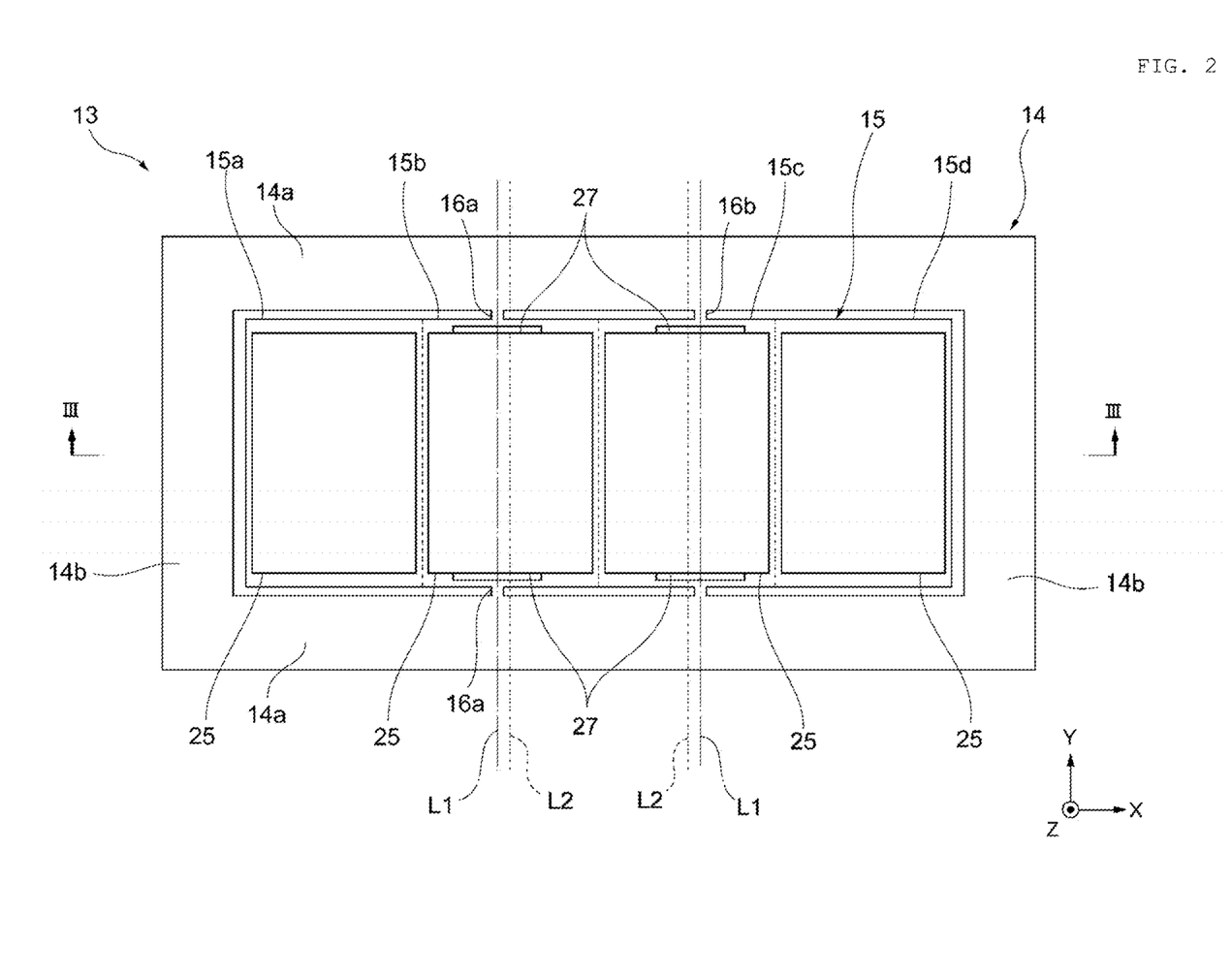
FIG. 2 is a plan view that schematically illustrates a structure of a resonator illustrated in FIG. 1.
Figure 3:
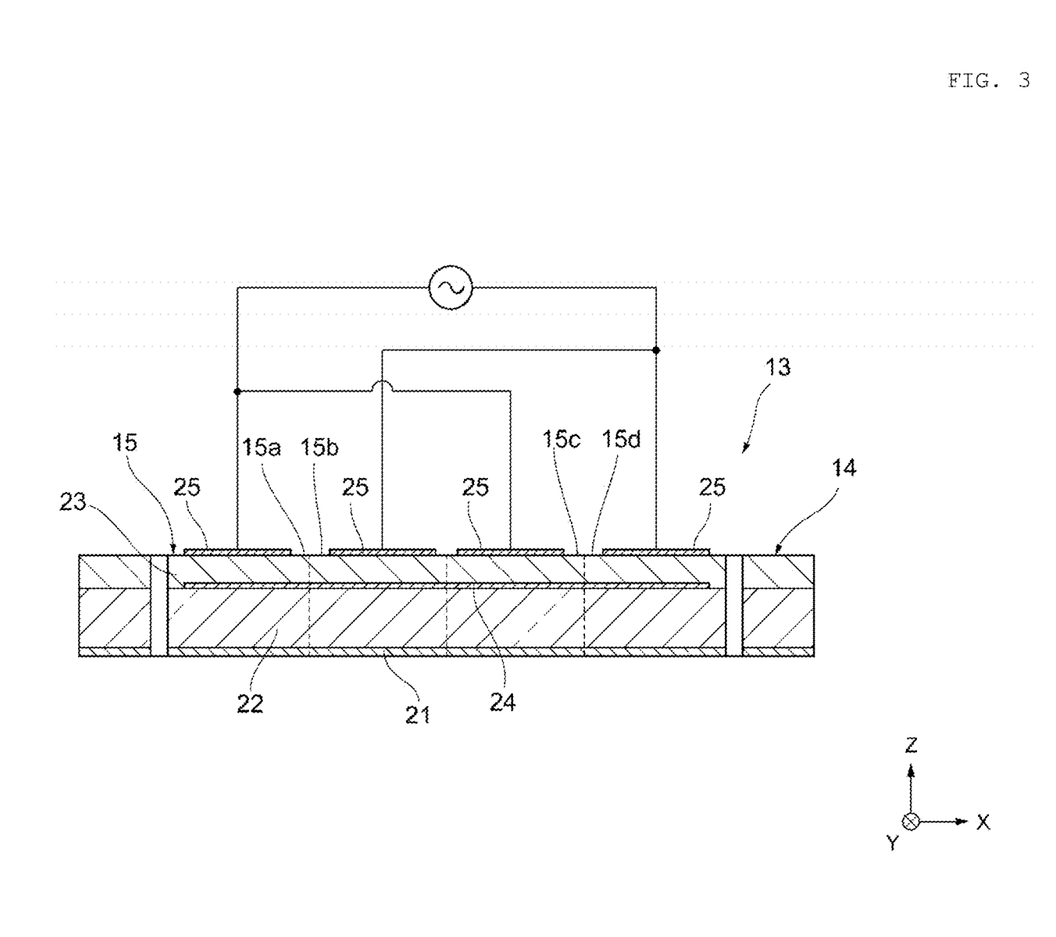
FIG. 3 is a cross-sectional view that schematically illustrates a configuration of a cross section along the line III-III of the resonator illustrated in FIG. 2.
Figure 4:
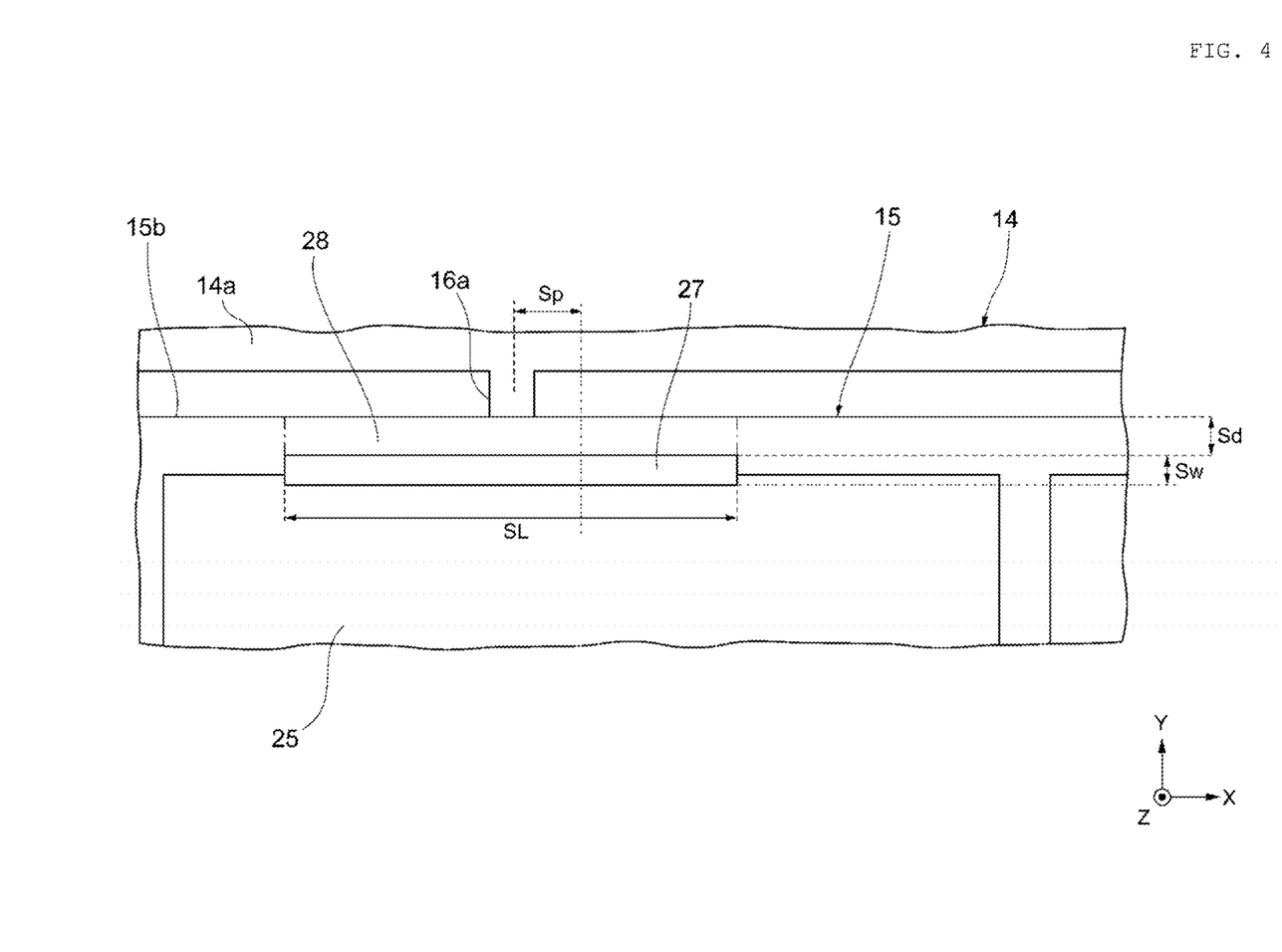
FIG. 4 is a plan view of an enlarged main portion, schematically illustrating a configuration of a through hole and its surroundings illustrated in FIG. 3.

Next, a schematic configuration of the resonator according to the exemplary embodiment is described with reference to FIGS. 2 to 4. FIG. 2 is a plan view that schematically illustrates a structure of the resonator 13 illustrated in FIG. 1. FIG. 3 is a cross-sectional view that schematically illustrates a configuration of a cross section along the line III-III illustrated in FIG. 2. FIG. 4 is a plan view of an enlarged main portion, schematically illustrating a configuration of a through hole 27 and its surroundings illustrated in FIG. 3.

As illustrated in FIG. 2, the vibrating section 15 includes four vibration regions 15a to 15d aligned in a predetermined direction, that is, the X-axis direction. In FIG. 2, the boundaries between the vibration regions 15a to 15d are illustrated by dotted lines. In the present embodiment, the vibration regions 15a to 15d have the same width in the X-axis direction and the same length in the Y-axis direction. That is, the vibration regions 15a to 15d define four equal regions divided in the X-axis direction according to the exemplary aspect.

As previously described, the vibrating section 15 is supported by the holding section 14 (or frame) by the two sets of supporting sections 16a, 16a and 16b, 16b. The set of supporting sections 16a, 16a connects the vibration region 15b, which is an inner side portion with respect to the vibration region 15a, which is an outer side portion, and the frame units 14a, 14a. The other set of supporting sections 16b, 16b connects the vibration region 15c, which is an inner side portion with respect to the vibration region 15d, which is an outer side portion, and the frame units 14a, 14a.

As illustrated in FIG. 3, the vibrating section 15 includes a silicon oxide film 21, an active layer laminated on the silicon oxide film 21, that is, silicon layer 22, a piezoelectric thin film 23 laminated on the silicon layer 22, for example, one lower electrode film 24 disposed on the lower surface of the piezoelectric thin film 23, and a plurality of upper electrode films 25 disposed on the upper surface of the piezoelectric thin film 23. The silicon oxide film 21 may be disposed on at least one of the upper surface and the lower surface of the piezoelectric thin film 23.

According to the exemplary aspect, the silicon oxide film 21 is a film for adjusting the frequency temperature characteristics of the resonator 13 and may be formed by, for example, the use of silicon dioxide ($SiO_2$). The silicon oxide film 21 is formed on the surface of the silicon layer 22 by oxidation of the surface of the silicon layer 22 or chemical vapor deposition (CVD). The silicon oxide film 21 can be formed by the use of a silicon oxide material containing an appropriate composition of $Si_aO_b$ layer (a and b are positive integers) in place of silicon dioxide.

The silicon layer 22 is made of an n-type silicon semiconductor in a degenerate state and includes phosphorus (P), arsenic (As), antimony (Sb), or the like as an n-type dopant. An example of the value of resistance of the degenerate n-type silicon may be less than 16 mΩ·cm or may more preferably be not more than 1.2 mΩ·cm.

The lower electrode film 24 lies across the boundaries of all the vibration regions 15a to 15d and is an electrode shared by all the vibration regions 15a to 15d. The lower electrode film 24 is formed as a floating electrode. The upper electrode films 25 correspond to the vibration regions 15a to 15d on a one-to-one basis. A metal whose crystal structure is body-centered cubic structure is used in the lower electrode film 24 and the upper electrode films 25. Specifically, the lower electrode film 24 and the upper electrode films 25 are formed by the use of molybdenum (Mo), tungsten (W), or the like. In place of the single lower electrode film 24 for all of the vibration regions 15a to 15d, four lower electrode films 24 for the respective vibration regions 15a to 15d may be formed.

The piezoelectric thin film 23 is a piezoelectric thin film configured to convert applied voltage into vibration. The piezoelectric thin film 23 is made of a material whose crystal structure has the hexagonal wurtzite structure, and an example of its principal component can be a nitride or an oxide, such as aluminium nitride (AlN), scandium aluminium nitride (ScAlN), zinc oxide (ZnO), gallium nitride (GaN), or indium nitride (InN). The scandium aluminium nitride is the one in which a portion of aluminium in aluminium nitride is replaced by scandium, and that scandium may be replaced by two elements of magnesium (Mg) and niobium (Nb), that of magnesium (Mg) and zirconium (Zr), or the like.

The piezoelectric thin film 23 is oriented along the c axis, that is, its thickness direction (Z-axis direction) with respect to the silicon layer 22.

In operation, each of the upper electrode films 25 receives an alternating electric field applied in the thickness direction such that the neighboring upper electrode films 25 are in mutually opposite phases. Thus, the vibration regions 15a to 15d are mechanically coupled, and it causes the vibrating section 15 to vibrate in a contour vibration mode at a harmonic as a whole. That is, vibration in a width expansion mode in which a state where the vibrating section 15 expands and a state where the vibrating section 15 shrinks are repeated in the X-axis direction occurs in the vibrating section 15.

The term "contour vibration" in the present disclosure is used as a generic term for expansion vibration, width expansion vibration at which the dimension in the width direction (X-axis direction) changes, and vibration in which expansion and shrinkage occur in the longitudinal direction (Y-axis direction).

As illustrated in FIG. 2, the vibrating section 15 includes the four through holes 27 (or slits). The through holes 27 are in positions corresponding to the supporting sections 16a, 16a and the supporting sections 16b, 16b. In other words, the vibration region 15b connected to the supporting sections 16a, 16a and the vibration region 15c connected to the supporting sections 16b, 16b include the through holes 27. The through holes 27 extend through the vibrating section 15 in the Z-axis direction and extend along the X-axis direction. An example of each of the through holes 27 has a rectangular outline that is long in the X-axis direction (e.g., as slits).

As illustrated in FIG. 4, in the vibrating section 15, a coupling section 28 is disposed between the through hole 27 and the supporting section 16a. The coupling section 28 extends in the X-axis direction, which is perpendicular to the Y-axis direction.

Hence, because the vibrating section 15 includes the through holes 27 extending along the X-axis direction such that the coupling sections 28 are disposed between the through holes 27 and the supporting sections 16a, 16a and supporting sections 16b, 16b, in comparison with the case where the through hole is disposed in the holding section or between the holding section and the vibrating section, the dimensions of the resonator 13 can be maintained. Accordingly, an increase in the dimensions of the resonator 13 can be prevented.

Here, when vibration of the vibrating section 15 is transmitted to the coupling section 28, the vibration is converted at the coupling section 28 mainly into flexure vibration in the Y-axis direction. Because the interfaces between the coupling section 28 and the vibrating section 15 indicated by the dot-and-dash lines in FIG. 4 are fixed ends of that flexure vibration, the flexure vibration in the coupling section 28 is reflected at the interfaces, and the vibration is confined in the coupling section 28. As a result, transmission of the vibration of the vibrating section 15 to the frame unit 14a through the supporting section 16a can be effectively suppressed.

The through hole 27 has the length SL in the X-axis direction and the length Sw in the Y-axis direction as seen in plan view, and the length Sw is shorter than the length SL (length SL>length Sw). The coupling section 28 has the length in the X-axis direction substantially the same as the length SL of the through hole 27 in the X-axis direction and the length Sd in the Y-axis direction. Similarly, the length SL of the through hole 27 in the X-axis direction is longer than the length Sd of the coupling section 28 in the Y-axis direction.

More specifically, the length SL of the through hole 27 in the X-axis direction may preferably be sufficiently longer than the length Sd of the coupling section 28 in the Y-axis direction.

As for each of the through holes other than the through hole 27 illustrated in FIG. 4, the coupling section 28 is disposed between the through hole and the supporting section 16a or the supporting section 16b, 16b, the configuration is similar to the above-described one, and illustration and description of them are omitted.

Figure 5:
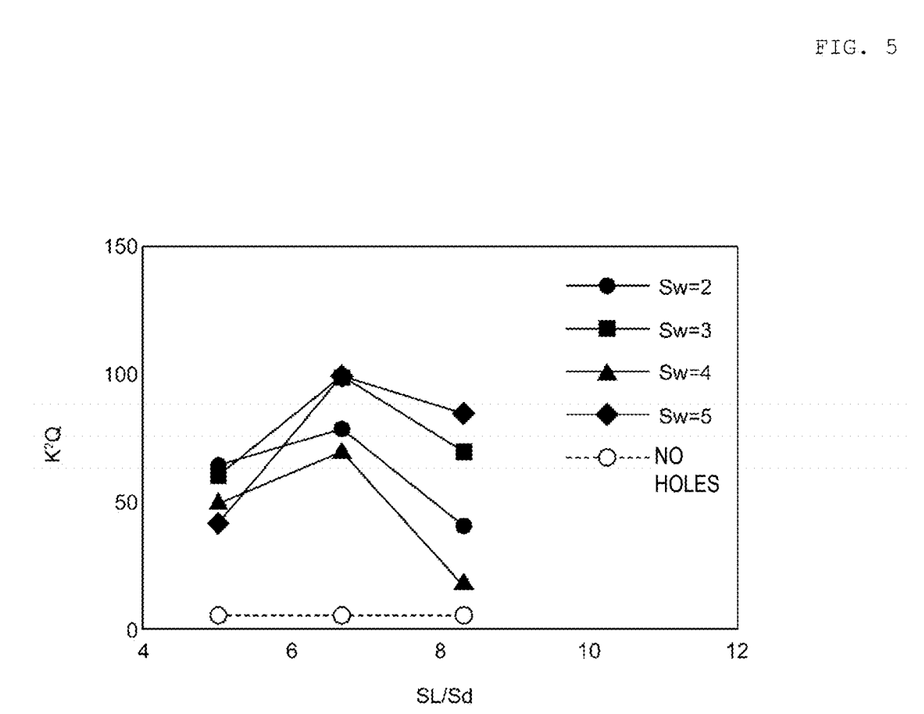
FIG. 5 is a graph that illustrates an example relationship between the length of the through hole in an X-axis direction and the length of a coupling section 28 in a Y-axis direction when the amount of displacement is zero.

Here, the advantages of the through holes included in the vibrating section and the coupling sections are described with reference to FIG. 5. In FIG. 5, the amount Sp of displacement, which is described below, is zero (none). FIG. 5 is a graph that illustrates an example relationship between the length SL of the through hole 27 in the X-axis direction and the length Sd of the coupling section 28 in the Y-axis direction when the amount Sp of displacement is zero. In FIG. 5, the horizontal axis indicates the ratio SL/Sd of the length SL of the through hole 27 in the X-axis direction to the length Sd of the coupling section 28 in the Y-axis direction, and the vertical axis indicates the value $k^2Q$ expressed by the use of the electromechanical coupling coefficient k and the Q value Q and being an index of the resonator characteristics. The ratios SL/Sd plotted in FIG. 5 are 5.0, 6.7, and 8.3 in ascending order. In FIG. 5, for comparison, the value $k^2Q$ when the through holes are absent (no holes) is expressed by the broken line and open circles.

As illustrated in FIG. 5, the length Sw of the through hole 27 in the Y-axis direction was changed from 2 μm to 5 μm. The result reveals that in the resonator characteristics, the influence of the length Sw of the through hole in the Y-axis direction is small. It is revealed that for the ratio SL/Sd not less than five, the value $k^2Q$ is larger than that in the case where the through holes are absent, and thus the resonator characteristics are improved.

Hence, because the length SL of the through hole 27 in the X-axis direction is longer than the length Sd of the coupling section 28 in the Y-axis direction, when the vibrating section 15 vibrates, the coupling section 28 is easily deformed, and the vibration of the vibrating section 15 can be confined. Accordingly, transmission of the vibration from the vibrating section 15 to the holding section 14 can be suppressed, and the resonator characteristics of the resonator 13 can be improved.

As illustrated in FIG. 2, the sets of supporting sections 16a, 16a and 16b, 16b are in positions where their center lines L1 in the X-axis direction are displaced from the center line L2 of the inner vibration regions 15b and 15c in the X-axis direction toward the outer side portion.

As previously described, the vibration region 15b is adjacent to the vibration regions 15a and 15c on its opposite sides, and the vibration region 15c is adjacent to the vibration regions 15b and 15d on its opposite sides. The inventors of the present invention found that the displacement of the vibration regions adjacent to the inner vibration regions 15b and 15c had an effect on the vibration regions 15b and 15c, and actual displacement minimum points (i.e., distortion maximum points) of the vibration regions 15b and 15c were displaced from the center lines L2, where original displacement minimum points (i.e., distortion maximum points) would be positioned, of the vibration regions 15b and 15c in the X-axis direction toward the inner side portion and outer side portion of the vibrating section 15.

Consequently, in each of the sets of supporting sections 16a, 16a and 16b, 16b, the center line L1 in the X-axis direction may preferably be displaced from the center line L2 of the inner vibration region 15b or 15c in the X-axis direction toward the inner side portion or outer side portion.

Similarly, the center lines of the through holes 27 in the inner vibration regions 15b and 15c in the X-axis direction may preferably be displaced from the center lines L2 of the vibration regions 15b and 15c in the X-axis direction toward the inner side portion or outer side portion. In that case, the center lines L1 of the sets of supporting sections 16a, 16a and 16b, 16b coincide with the center lines of the through holes 27 in the inner vibration regions 15b and 15c in the X-axis direction, respectively.

As a result, the center line L1 of each of the sets of supporting sections 16a, 16a and 16b, 16b in the X-axis direction may preferably be displaced toward the inner side portion or outer side portion of the vibrating section 15, that is, the actual displacement minimum point and be matched to the actual displacement minimum point. Thus, losses of vibration of the vibration regions 15b and 15c caused by being supported by the supporting sections 16a and 16b can be minimized.

The center lines of the upper electrode films 25 in the X-axis direction in the inner vibration regions 15b and 15c may preferably be displaced toward the inner side portion or outer side portion of the vibrating section 15, that is, the actual displacement minimum points, and the upper electrode films 25 may preferably be centered about the actual distortion maximum points. Therefore, the vibration efficiency of the vibrating section 15 can be enhanced, and the resonator characteristics of the resonator 13 can be further improved.

Figure 6:
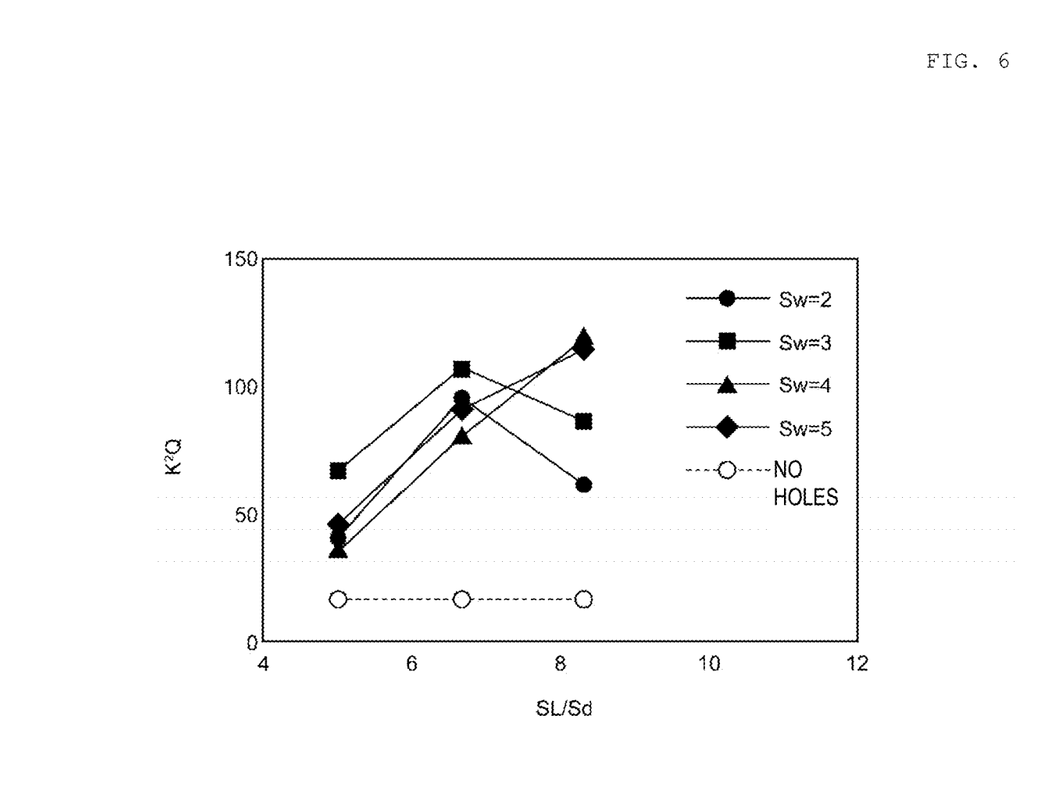
FIG. 6 is a graph that illustrates an example relationship between the length of the through hole in the X-axis direction and the length of the coupling section in the Y-axis direction when the amount of displacement is 3 µm.
Figure 7:
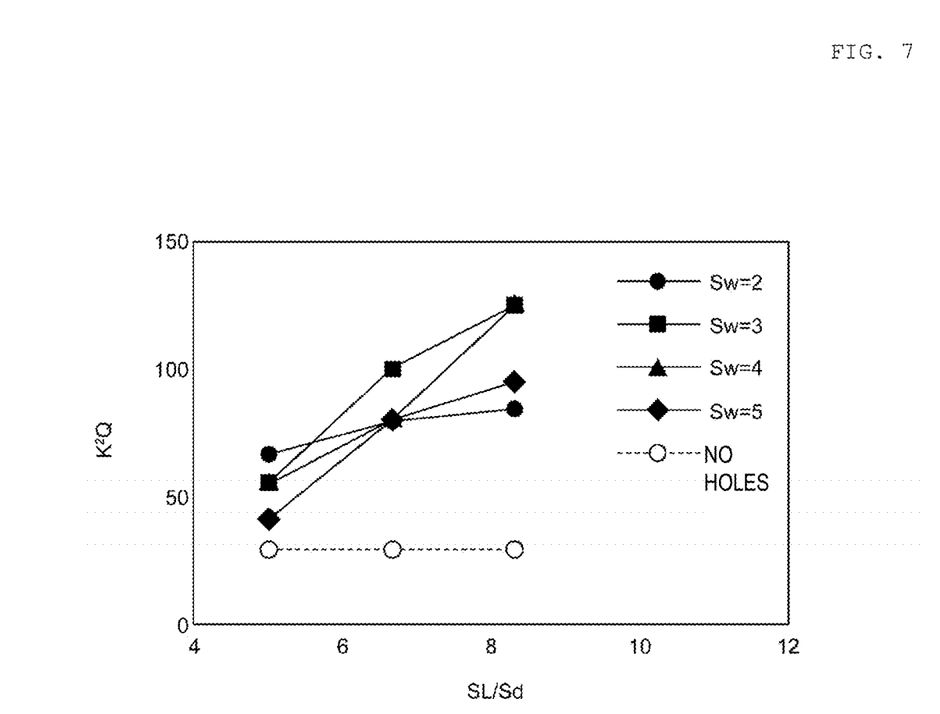
FIG. 7 is a graph that illustrates an example relationship between the length of the through hole in the X-axis direction and the length of the coupling section in the Y-axis direction when the amount of displacement is 5 µm.
Figure 8:
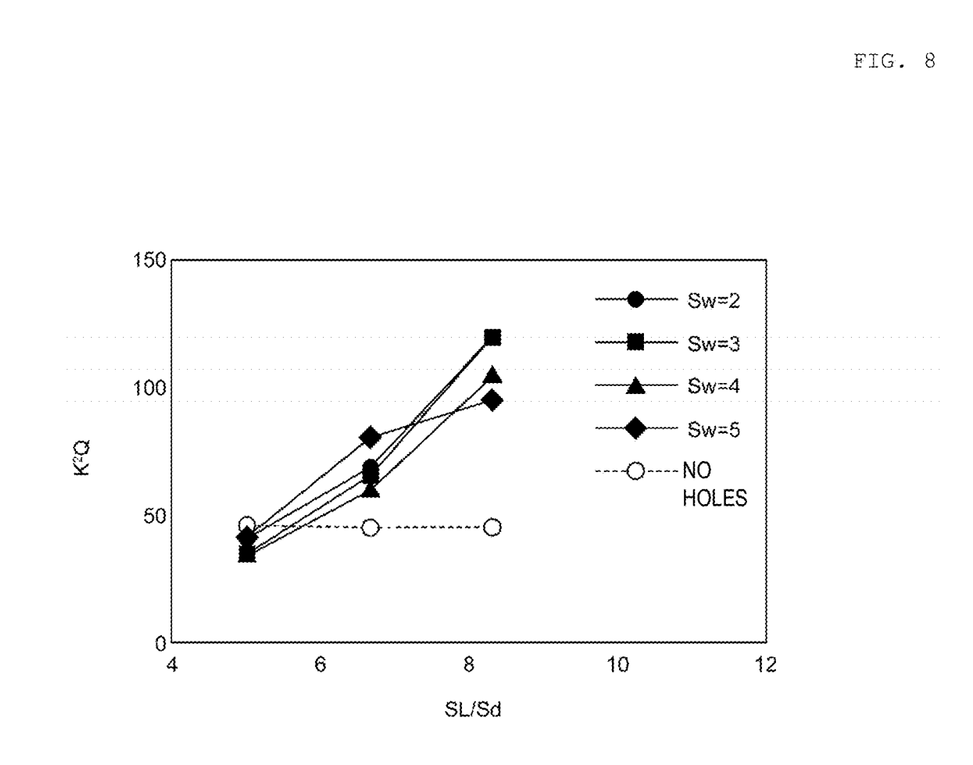
FIG. 8 is a graph that illustrates an example relationship between the length of the through hole in the X-axis direction and the length of the coupling section in the Y-axis direction when the amount of displacement is 7.5 µm.

Here, the advantages of displacement of the center line of the supporting section in the X-axis direction from the center line of the vibration region in the X-axis direction are described with reference to FIGS. 6 to 8. In FIGS. 6 to 8, the displacement between the center line L1 and the center line L2 is expressed by the use of the amount Sp of displacement illustrated in FIG. 4. FIG. 6 is a graph that illustrates an example relationship between the length SL of the through hole 27 in the X-axis direction and the length Sd of the coupling section 28 in the Y-axis direction when the amount Sp of displacement is 3 μm. FIG. 7 is a graph that illustrates an example relationship between the length SL of the through hole 27 in the X-axis direction and the length Sd of the coupling section 28 in the Y-axis direction when the amount Sp of displacement is 5 μm. FIG. 8 is a graph that illustrates an example relationship between the length SL of the through hole 27 in the X-axis direction and the length Sd of the coupling section 28 in the Y-axis direction when the amount Sp of displacement is 7.5 μm. In FIGS. 6 to 8, the horizontal axis indicates the ratio SL/Sd of the length SL of the through hole 27 in the X-axis direction to the length Sd of the coupling section 28 in the Y-axis direction, and the vertical axis indicates the value $k^2Q$ being an index of the resonator characteristics. The ratios SL/Sd plotted in FIGS. 6 to 8 are 5.0, 6.7, and 8.3 in ascending order. In FIGS. 6 to 8, for comparison, the value $k^2Q$ when the through holes are absent is expressed by the broken line and open circles.

As illustrated in FIGS. 6 to 8, the length Sw of the through hole 27 in the Y-axis direction was changed from 2 μm to 5 μm. The result reveals that the resonator characteristics tend to improve as the amount Sp of displacement increases.

Hence, because the center lines L1 of the supporting sections 16a and 16b in the X-axis direction are displaced from the center lines L2 of the inner vibration regions 15b and 15c connected to the supporting sections 16a and 16b in the X-axis direction, the resonator characteristics of the resonator 13 can be further improved.

Because the center lines L1 of the supporting sections 16a and 16b in the X-axis direction coincide with the center lines of the through holes 27 in the inner vibration regions 15b and 15c connected to the supporting sections 16a and 16b in the X-axis direction, respectively, the resonator characteristics of the resonator 13 can be further improved.

As in the case of FIG. 5, it is revealed that when the ratio SL/Sd not less than five, the resonator characteristics are improved, in comparison with the case where the through holes are absent. In particular, when the ratio SL/Sd is not less than six, the resonator characteristics is noticeably improved.

Hence, because the ratio SL/Sd of the length SL of the through hole 27 in the X-axis direction to the length Sd of the coupling section 28 in the Y-axis direction is not less than six, the resonator characteristics of the resonator 13 can be further improved.

Figure 9:
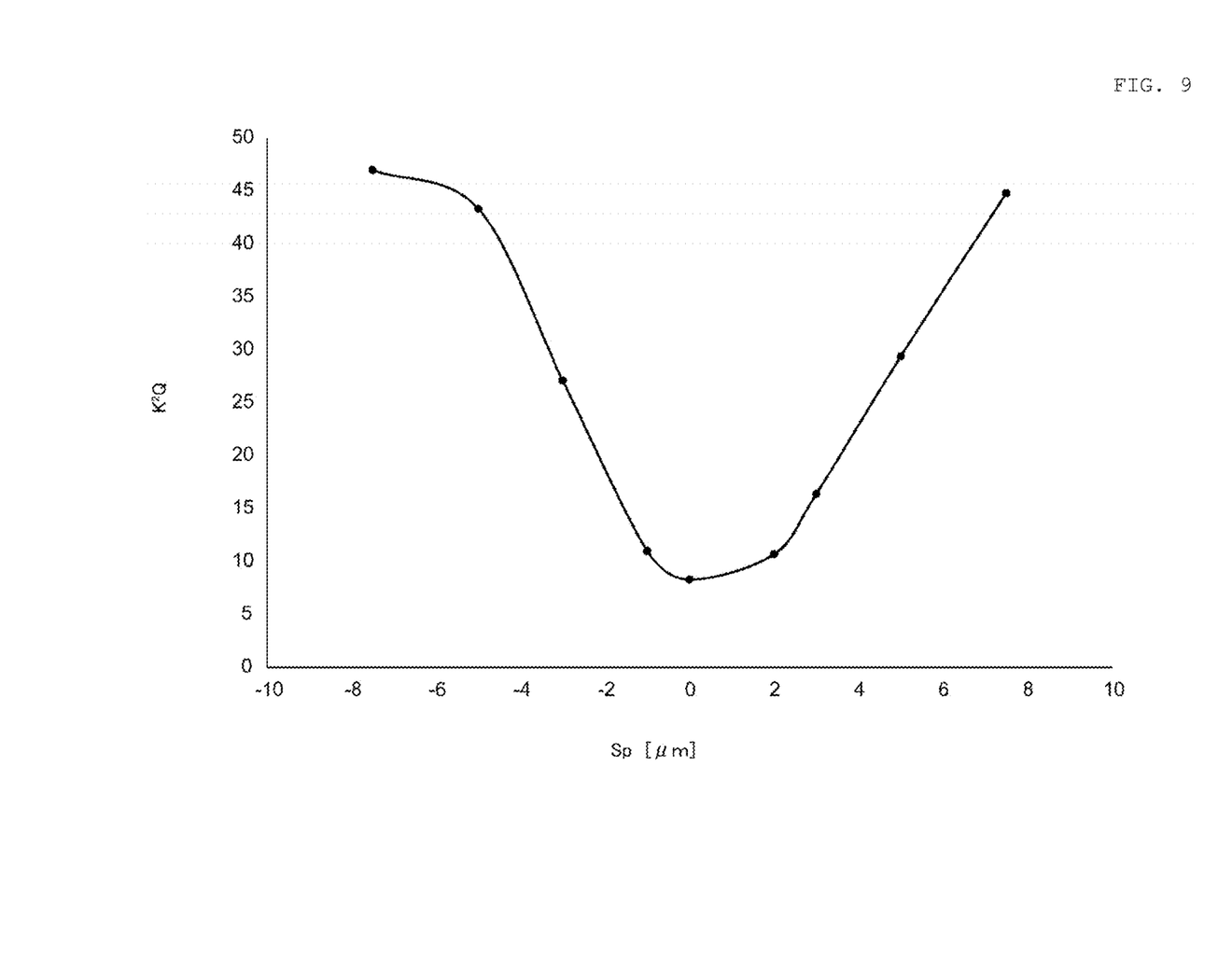
FIG. 9 is a graph that illustrates an example relationship between the amount of displacement between the center line of a supporting section in the X-axis direction and the center line of an inner vibration region in the X-axis direction and its orientation.

Next, the orientation of the displacement between the center line of the supporting section in the X-axis direction and the center line of the vibration region in the X-axis direction is described with reference to FIG. 9. In FIG. 9, the amount Sp of displacement when the center line L1 is displaced from the center line L2 toward the inner side portion of the vibrating section 15 is a positive value, whereas the amount Sp of displacement when the center line L1 is displaced from the center line L2 toward the outer side portion of the vibrating section 15 is a negative value. FIG. 9 is a graph that illustrates an example relationship between the amount Sp of displacement between the center lines L1 of the supporting sections 16a and 16b in the X-axis direction and the center lines L2 of the inner vibration regions 15b and 15c in the X-axis direction and the orientation thereof. In FIG. 9, the horizontal axis indicates the amount Sp of displacement, and the vertical axis indicates the value $k^2Q$ being an index of the resonator characteristics.

As illustrated in FIG. 9, when the amount Sp of displacement is zero, that is, when the center lines L1 of the supporting sections 16a and 16b in the X-axis direction coincide with the center lines L2 of the inner vibration regions 15b and 15c in the X-axis direction, respectively, the resonator characteristics are the lowest. In both of the case where the amount Sp of displacement is a positive value, that is, the center lines L1 of the supporting sections 16a and 16b in the X-axis direction are displaced from the center lines L2 of the inner vibration regions 15b and 15c in the X-axis direction toward the inner side portion of the vibrating section 15, respectively, and the case where the amount Sp of displacement is a negative value, that is, the center lines L1 of the supporting sections 16a and 16b in the X-axis direction is displaced from the center lines L2 of the inner vibration regions 15b and 15c in the X-axis direction toward the outer side portion of the vibrating section 15, respectively, the resonator characteristics are improved. Accordingly, the resonator characteristics tend to be improved independently of the orientation of the displacement between the center line L1 and the center line L2.

In the present embodiment, the example in which the vibrating section 15 including the four vibration regions 15a to 15d are supported by the two sets of supporting sections 16a, 16a and 16b, 16b is described. However, it is noted that the embodiments are not limited to that example. In another example, the vibrating section 15 including the four vibration regions 15a to 15d may be supported by four sets of supporting sections. In that case, the sets of supporting sections connect the respective vibration regions 15a to 15d to the frame units 14a, 14a, and eight through holes 27 are disposed in the vibration regions 15a to 15d in the vibrating section 15 such that the coupling sections 28 are disposed between the through holes 27 and the sets of supporting sections.

In the present embodiment, the example in which the vibrating section 15 includes the four vibration regions 15a to 15d is described. However, the embodiments are not limited to that example. In another example, the vibrating section 15 may include five vibration regions aligned in the X-axis direction. In that case, a vibration region is added between the vibration regions 15b and 15c, that is, in the center of the vibrating section 15 in the X-axis direction. The vibrating section 15 is supported by the single set of supporting sections 16a, 16a, and these supporting sections 16a, 16a are connected to the added central vibration region. Two through holes 27 are disposed in that vibration region such that the coupling sections 28 are disposed between the through holes and the single set of supporting sections 16a, 16a.

Furthermore, in the present embodiment, the example in which each of the through holes 27 is a single hole having a rectangular shape as seen in plan view is described. The embodiments are not limited to that example. In another example, each of the through holes 27 may have a non-rectangular shape and may consist of a plurality of holes.

(First Variation)

Figure 10:
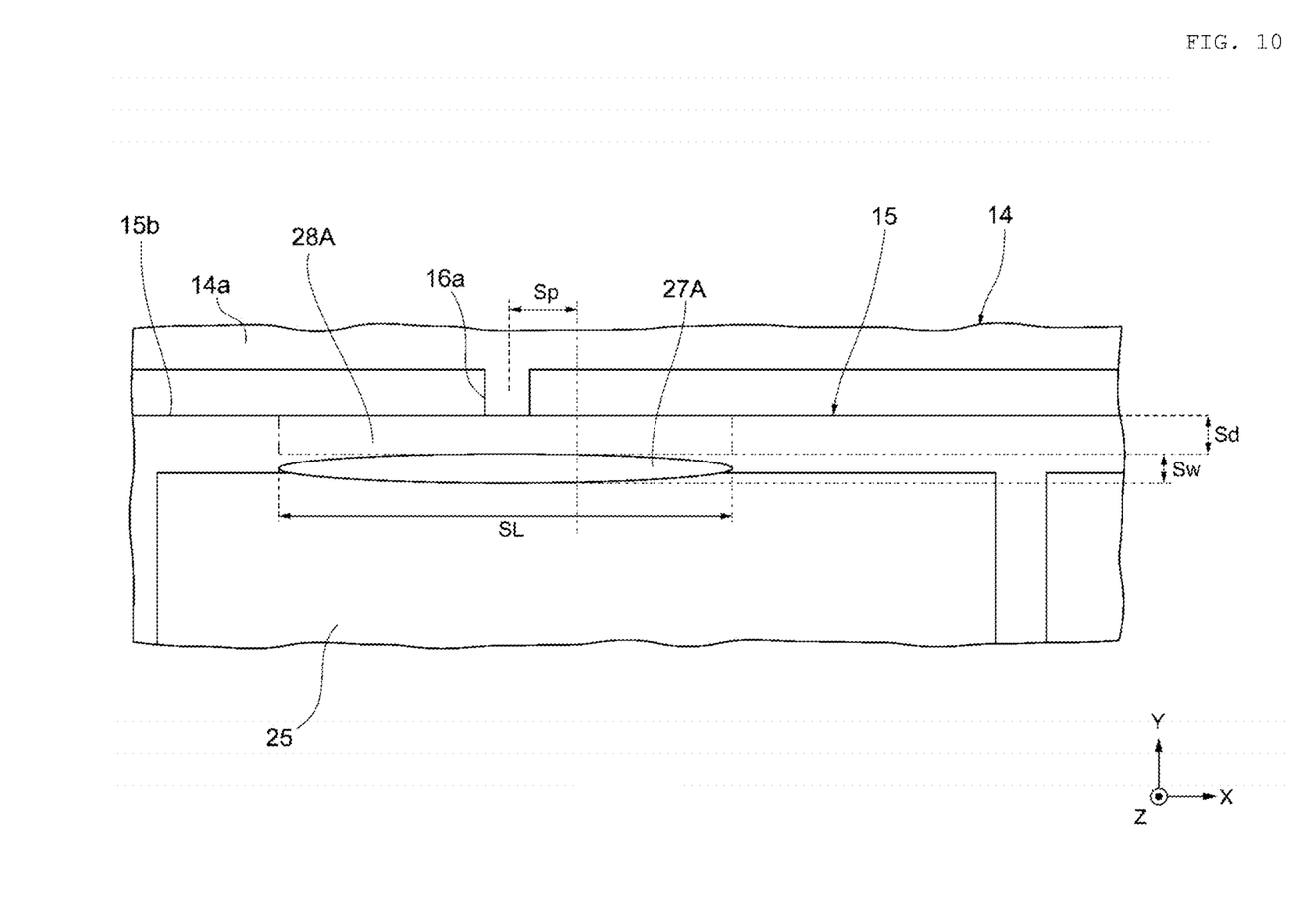
FIG. 10 is a plan view of an enlarged main portion, schematically illustrating a first variation of the configuration of the through hole and its surroundings illustrated in FIG. 4.

FIG. 10 is a plan view of an enlarged main portion, schematically illustrating a first variation of the configuration of the through hole 27 and its surroundings illustrated in FIG. 4. In the first variation, the same reference numerals are used in the same configuration as that of the through hole 27 illustrated in FIG. 4, and the description thereof is omitted as appropriate. Similar operational effects from similar configurations are not fully described.

As illustrated in FIG. 10, a through hole 27A does not have a rectangular shape, but instead has an oval shape elongated in the X-axis direction as seen in plan view. A coupling section 28A is disposed between the through hole 27A and the supporting section 16a. The coupling section 28A is elongated in the X-axis direction, which is perpendicular to the Y-axis direction. The interface between the coupling section 28A and the vibrating section 15 is indicated by the dot-and-dash lines in FIG. 10.

(Second Variation)

Figure 11:
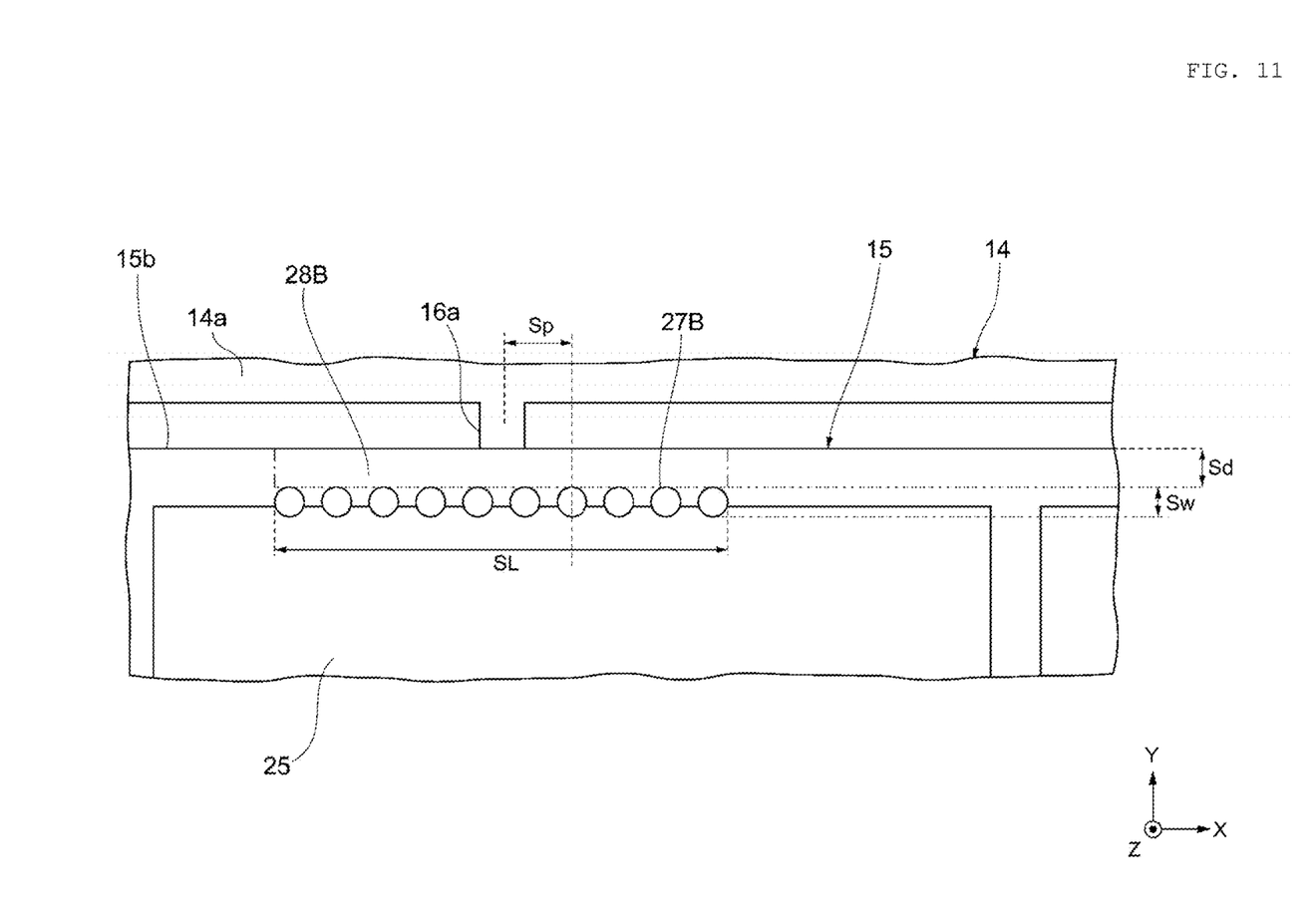
FIG. 11 is a plan view of an enlarged main portion, schematically illustrating a second variation of the configuration of the through hole and its surroundings illustrated in FIG. 4.

FIG. 11 is a plan view of an enlarged main portion, schematically illustrating a second variation of the configuration of the through hole 27 and its surroundings illustrated in FIG. 4. In the second variation, the same reference numerals are used in the same configurations as that of the through hole 27 illustrated in FIG. 4, and the description thereof is omitted as appropriate. Similar operational effects from similar configurations are not fully described.

As illustrated in FIG. 11, a through hole 27B comprises a plurality of holes. As shown, the holes are arranged along the X-axis direction and spaced away from each other.

The length Sw of the through hole 27B in the Y-axis direction is substantially the same as the dimeter of each of the holes, and the length SL of the through hole 27B in the X-axis direction is the distance from an end (left end) to another end (right end) of the plurality of holes in the X-axis direction. A coupling section 28B is disposed between the through hole 27B and the supporting section 16a. The coupling section 28B is elongated in the X-axis direction, which is perpendicular to the Y-axis direction. The length Sd of the coupling section 28B in the Y-axis direction is the distance between the outer edge of the vibrating section 15 and an end (upper end) of the hole nearest the outer edge. The interface between the coupling section 28B and the vibrating section 15 is indicated by the dot-and-dash lines in FIG. 11.

In general, the illustrative embodiments of the present invention are described above. In the resonator according to one exemplary embodiment, the vibrating section includes the through hole extending along the X-axis direction such that the coupling section is disposed between the through hole and the supporting section. Thus, in comparison with the case where the through hole is disposed in the holding section or between the holding section and the vibrating section, the dimensions of the resonator can be maintained. Accordingly, an increase in the dimensions of the resonator can be suppressed. The length of the through hole in the X-axis direction is longer than the length of the coupling section in the Y-axis direction. Thus, the coupling section can be easily deformed when the vibrating section vibrates, and the vibration of the vibrating section can be confined. Accordingly, transmission of the vibration from the vibrating section to the holding section can be suppressed, and the resonator characteristics of the resonator can be improved.

In the resonator described above, the ratio of the length of the through hole in the X-axis direction to the length of the coupling section in the Y-axis direction may be not less than six. Thus, the resonator characteristics of the resonator can be further improved.

In the resonator described above, the vibrating section may include the plurality of vibration regions, each of which vibrates in an opposite phase to the phase in which its neighboring vibration region vibrates. Thus, the resonator having the improved resonator characteristics and vibrating in a contour vibration mode at a harmonic can be easily achieved.

In the resonator described above, the center line of the supporting section in the X-axis direction may be displaced from the center line of the inner vibration region connected to the supporting section in the X-axis direction. Thus, the resonator characteristics of the resonator 13 can be further improved.

In the resonator described above, the center line of the supporting section in the X-axis direction may coincide with the center line of the through hole in the inner vibration region connected to the supporting section in the X-axis direction. Thus, the resonator characteristics of the resonator can be further improved.

In the resonator described above, the center line of the supporting section in the X-axis direction may coincide with the displacement minimum point of the vibration region connected to the supporting section. Thus, losses of vibration of the vibration region caused by being supported by the supporting section can be minimized.

In the resonator described above, the through hole may include the plurality of holes arranged along the X-axis direction. In that case, similar advantages to those in the case where the number of through holes is one are obtainable.

The resonance device according to one exemplary embodiment includes the above-described resonator and the lid unit. Thus, the resonance device whose resonator characteristics are improved while an increase in the dimensions is suppressed can be easily achieved.

It is noted that the exemplary embodiments are described above for ease of understanding of the present invention and are not intended to limit the scope of the present invention. The present invention can be changed or modified without departing from its spirit, and its equivalents are also included in the present invention. That is, design changes may be suitably made to the embodiments by those skilled in the art, and such embodiments are also included in the scope of the present invention as long as they have the features of the present invention. For example, the elements included in the embodiments and the arrangements, materials, conditions, shapes, sizes, and the like of the elements are not limited to the illustrated examples, and they may be suitably changed. The embodiments are illustrative, and the configurations illustrated in different embodiments can be replaced or combined in part, and resultant embodiments are also included in the scope of the present invention as long as they have the features of the present invention.

REFERENCE SIGNS LIST 10 resonance device, 11 lower substrate, 12 upper substrate, 13 resonator, 14 holding section, 14a, 14b frame unit, 15 vibrating section, 15a, 15b, 15c, 15d vibration region, 16a, 16b supporting section, 17, 18 recess section, 21 silicon oxide film, 22 silicon layer, 23 piezoelectric thin film, 24 lower electrode film, 25 upper electrode film, 27, 27A, 27B through hole, 28, 28A, 28B coupling section, k electromechanical coupling coefficient, L1, L2 center line, Q Q value, Sd length, SL length, Sw length, Sp amount of displacement

The invention claimed is:

1. A resonator comprising:
a vibrating section configured to vibrate in a contour vibration mode;
a frame that surrounds at least a portion of the vibrating section; and
a supporting section extending along a first direction and connecting the vibrating section to the frame,
wherein the vibrating section includes a through hole that extends in a second direction perpendicular to the first direction to define a coupling section that is disposed between the through hole and the supporting section,
wherein the through hole has a length extending in the second direction that is longer than a length of the coupling section extending in the first direction, and
wherein the through hole includes a plurality of holes arranged adjacent to one another and extending along the second direction.

2. The resonator according to claim 1, wherein a ratio of the length of each of the plurality of through holes extending in the second direction to the length of the coupling section extending in the first direction is at least six to one.

3. The resonator according to claim 1, wherein the vibrating section includes a plurality of vibration regions, and each of the vibration regions is configured to vibrate in an opposite phase to a phase in which a neighboring vibration region vibrates.

4. The resonator according to claim 3, wherein the vibrating section comprises an even number of vibration regions that is greater than or equal to two.

5. The resonator according to claim 4, wherein each of the plurality of through holes is disposed in the vibration region that is connected to the supporting section.

6. The resonator according to claim 5, wherein a center line of the supporting section in the second direction coincides with a center line of at least one of the plurality of through holes in the vibration region connected to the supporting section in the second direction.

7. The resonator according to claim 4, wherein a center line of the supporting section extending in the second direction coincides with a displacement minimum point of the vibration region connected to the supporting section.

8. The resonator according to claim 1, wherein at least one of the plurality of through holes comprises a rectangular shaped slit.

9. The resonator according to claim 1, wherein at least one of the plurality of through holes comprises an oval shape elongated in the second direction.

10. The resonator according to claim 1,
wherein the vibrating section comprises four vibration regions coupled to the frame by four sets of the supporting section, and
wherein the plurality of through holes comprises eight through holes disposed in the four vibration regions such that a plurality of coupling sections are respectively disposed between the eight through holes and the sets of supporting sections.

11. The resonator according to claim 1,
wherein the vibrating section comprises five vibration regions coupled to the frame by a single set of the supporting sections connected to a central vibration region of the five vibration regions, and
wherein the plurality of through holes comprises two through holes disposed in the central vibration region such that respective coupling sections are respectively disposed between the two through holes and the single set of supporting sections.

12. A resonance device comprising:
the resonator according to claim 1; and
a lid unit having upper and lower substrates that hold the resonator therebetween.

13. A resonator comprising:
a vibrating section configured to vibrate in a contour vibration mode and including an even number of vibration regions that that is greater than or equal to two, with each vibration region being configured to vibrate in an opposite phase to a phase in which a neighboring vibration region vibrates;
a frame that surrounds at least a portion of the vibrating section; and
a supporting section extending along a first direction and connecting the vibrating section to the frame,
wherein the vibrating section includes a through hole that extends in a second direction perpendicular to the first direction to define a coupling section that is disposed between the through hole and the supporting section,
wherein the through hole has a length extending in the second direction that is longer than a length of the coupling section extending in the first direction, and
wherein a center line of the supporting section in the second direction is displaced from a center line of the vibration region connected to the supporting section in the second direction.

14. A resonator comprising:
a vibrating section configured to vibrate in a contour vibration mode;

a frame that surrounds at least a portion of the vibrating section; and a supporting section that extends in a first direction and connects a coupling section of the vibrating section to the frame, wherein a through hole is disposed in the vibrating section and has elongated shape extending in a second direction perpendicular to the first direction, such that the coupling section is disposed between the through hole and the supporting section, wherein the through hole has a length in the second direction that is greater than a width of the coupling section in the first direction, and wherein the through hole includes a plurality of holes arranged adjacent to one another and extending along the second direction.

15. The resonator according to claim 14, wherein a ratio of each of the plurality of through holes in the second direction to the width of the coupling section in the first direction is at least six to one.

16. The resonator according to claim 14, wherein the vibrating section includes a plurality of vibration regions, and each of the vibration regions is configured to vibrate in an opposite phase to a phase in which a neighboring vibration region vibrates, and wherein the vibrating section comprises an even number of vibration regions that is greater than or equal to two.

17. The resonator according to claim 16, wherein a center line of the supporting section that extends in the second direction is displaced from a center line of the vibration region connected to the supporting section and that extends in the second direction.

18. The resonator according to claim 16, wherein the plurality of through holes are disposed in the vibration region that is connected to the supporting section.

19. The resonator according to claim 18, wherein a center line of the supporting section in the second direction coincides with a center line of at least one of the plurality of through holes in the vibration region connected to the supporting section in the second direction.

* * * * *